(12) United States Patent
Miller et al.

(10) Patent No.: US 8,707,971 B2
(45) Date of Patent: Apr. 29, 2014

(54) LAMINATED WALLS FOR UNIFORM FLUID FLOW

(75) Inventors: Kenneth C. Miller, Aptos, CA (US); Mike Wallis, Carlitos, CA (US)

(73) Assignee: Xyratex Corporation, Scotts Valley, CA (US)

(*) Notice: Subject to any disclaimer, the term of this patent is extended or adjusted under 35 U.S.C. 154(b) by 1245 days.

(21) Appl. No.: 12/122,571

(22) Filed: May 16, 2008

(65) Prior Publication Data

US 2009/0283158 A1  Nov. 19, 2009

(51) Int. Cl.
*H01L 21/02* (2006.01)

(52) U.S. Cl.
USPC ........ 134/100.1; 134/111; 134/186; 134/198; 239/590; 137/561 A; 156/345.11; 156/345.33

(58) Field of Classification Search
USPC ............... 134/111, 186, 198, 100.1; 239/553, 239/590; 137/561 A; 156/345.11, 345.33; 422/601–603, 606–607, 220
See application file for complete search history.

(56) References Cited

U.S. PATENT DOCUMENTS

| | | | | |
|---|---|---|---|---|
| 2,212,908 | A * | 8/1940 | Mitchell | 366/131 |
| 3,495,608 | A * | 2/1970 | O'Keefe | 137/815 |
| 4,537,217 | A * | 8/1985 | Allen, Jr. | 137/561 A |
| 4,609,010 | A * | 9/1986 | Watson | 137/587 |
| 4,627,918 | A * | 12/1986 | Saxena | 210/656 |
| 5,292,373 | A * | 3/1994 | Arita et al. | 134/2 |
| 5,503,336 | A * | 4/1996 | Wichmann | 239/708 |
| 6,000,422 | A * | 12/1999 | Shigemoto | 137/312 |
| 6,058,950 | A * | 5/2000 | Fujii et al. | 134/182 |
| 6,059,272 | A * | 5/2000 | Potthoff et al. | 261/97 |
| 6,502,591 | B1 * | 1/2003 | Scranton et al. | 134/133 |
| 6,503,362 | B1 * | 1/2003 | Bartels et al. | 156/345.17 |
| 6,505,634 | B2 * | 1/2003 | Son et al. | 134/104.4 |
| 6,736,633 | B1 * | 5/2004 | Dawson-Elli et al. | 431/328 |
| 6,949,172 | B1 * | 9/2005 | Hosten et al. | 204/275.1 |
| 6,981,522 | B2 * | 1/2006 | O'Connor et al. | 137/803 |
| 7,552,521 | B2 * | 6/2009 | Fink | 29/557 |
| 8,492,164 | B2 * | 7/2013 | Fitzgerald et al. | 436/180 |
| 2006/0275185 | A1 * | 12/2006 | Tonkovich et al. | 422/130 |
| 2009/0227114 | A1 * | 9/2009 | Ramirez et al. | 438/745 |

FOREIGN PATENT DOCUMENTS

| | | | | |
|---|---|---|---|---|
| EP | 1448 A1 | * | 4/1979 | |
| EP | 2078552 A1 | * | 7/2009 | |
| JP | 58-206119 | | 12/1983 | ............ H01J 37/32 |
| JP | 03-082028 | * | 4/1991 | |
| JP | 05-021413 | * | 1/1993 | |

(Continued)

*Primary Examiner* — Joseph L Perrin
*Assistant Examiner* — Kevin G Lee
(74) *Attorney, Agent, or Firm* — Womble Carlyle Sandridge & Rice, LLP (57) ABSTRACT

A chamber with a fluid distribution network for uniform fluid flow within the chamber is provided. The chamber includes a first chamber wall that has a first surface and an opposing interior surface. The first surface is formed with a first set of channels, and the interior surface is exposed to the interior of the chamber and includes a plurality of interior ports that are connected to a plurality of the first set of channels. The chamber also includes a second chamber wall that has a second surface and an opposing exterior surface. The second surface has a second set of channels that partially intersect the first set of channels when the first surface is mated with the second surface. The exterior surface also includes at least one exterior port that provides access to the second set of channels.

16 Claims, 9 Drawing Sheets

(56) References Cited

FOREIGN PATENT DOCUMENTS

| | | | | |
|---|---|---|---|---|
| JP | 05-299406 | * | 11/1993 | |
| JP | 09-209119 | | 8/1997 | ............ C23C 14/00 |
| JP | 10-308376 | * | 11/1998 | |
| JP | 11-090264 | * | 4/1999 | |
| JP | 11-090364 | * | 4/1999 | |
| JP | 11-347503 | * | 12/1999 | |
| JP | 2000-311881 | * | 11/2000 | |
| JP | 2001-191527 | * | 7/2001 | |
| JP | 2002-222806 | | 8/2002 | ............ C23C 16/455 |
| JP | 2004177161 A | * | 6/2004 | |
| KR | 10-2005-0000718 | | 1/2005 | ............ H01L 21/205 |

* cited by examiner

LAMINATED WALLS FOR UNIFORM FLUID FLOW

BACKGROUND

In many manufacturing processes for semiconductor and magnetic disk manufacturing, it is necessary to treat a work piece in a liquid environment and then dry the work piece. As is well known, particulates or contaminates that attach during the drying process may eventually cause defects in the work piece. Additionally, an inefficient drying process may result in extended processing times or even leave defects on a surface of the work piece, as well as promote oxidation. Thus, it is extremely important that when a substrate is dried, there are no impurities left on its surface. In order to promote efficient drying and reduce the likelihood of forming impurities, the embodiments described below expose the work pieces to evenly distributed heated gas after the work pieces are removed from the liquid environment.

SUMMARY

In one embodiment, a chamber with a fluid distribution network for uniform fluid flow within the chamber is provided. The chamber includes a first chamber wall that has a first surface and an opposing interior surface. The first surface is formed with a first set of channels and the interior surface is exposed to the interior of the chamber. The chamber also includes a plurality of interior ports that are connected to a plurality of the first set of channels. The chamber also includes a second chamber wall that has a second surface and an opposing exterior surface. The second surface has a second set of channels that partially intersecting the first set of channels when the first surface is mated with the second surface. The exterior surface also includes at least one exterior port providing access to the second set of channels.

In another embodiment a fluid distribution chamber is provided. The fluid distribution chamber includes a base that has sidewalls extending therefrom. Wherein one of the sidewalls includes a first member and a second member affixed to each other. The first member has an inner surface that mates with an outer surface of the second member. The inner surface of the first member also has a plurality of cavities defined in a first pattern of spaced apart rows. While the outer surface has a plurality of cavities defined in a second pattern of spaced apart columns. Wherein a cavity of the first pattern partially intersects with multiple cavities in the second pattern.

In still another embodiment, a method for distributing a fluid is disclosed. The method includes operations that provide a chamber that has a first and second walls affixed to each other that form a uniform fluid distribution network. Another operation initiates fluid flow through a port that is connected to the uniform fluid distribution network within the affixed walls. In another operation fluid flow is distributed within the affixed walls. The fluid flow being uniformly distributed between the walls through a first set of channels formed as part of the first wall that partially intersect an opposing second set of channels formed as part of the second wall.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

An invention is disclosed for evenly dispensing and/or removing a fluid within a chamber. As described below, in one embodiment the fluid can be a gas to effectuate drying of substrate materials. However, the claims should not be construed to limit the type of fluid capable of being dispensed and/or removed within the chamber to drying gases. One skilled in the art should recognize that a chamber including the claimed subject matter could be modified to accommodate liquids or gases. Other embodiments include chambers that are able to switch between configurations for distributing gases to a configuration for distributing liquids. Additionally, while the description below describes a chamber for drying substrate materials, in other embodiments, the chamber may be scaled to include fluid circulation for larger structures such as clean rooms or entire buildings.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
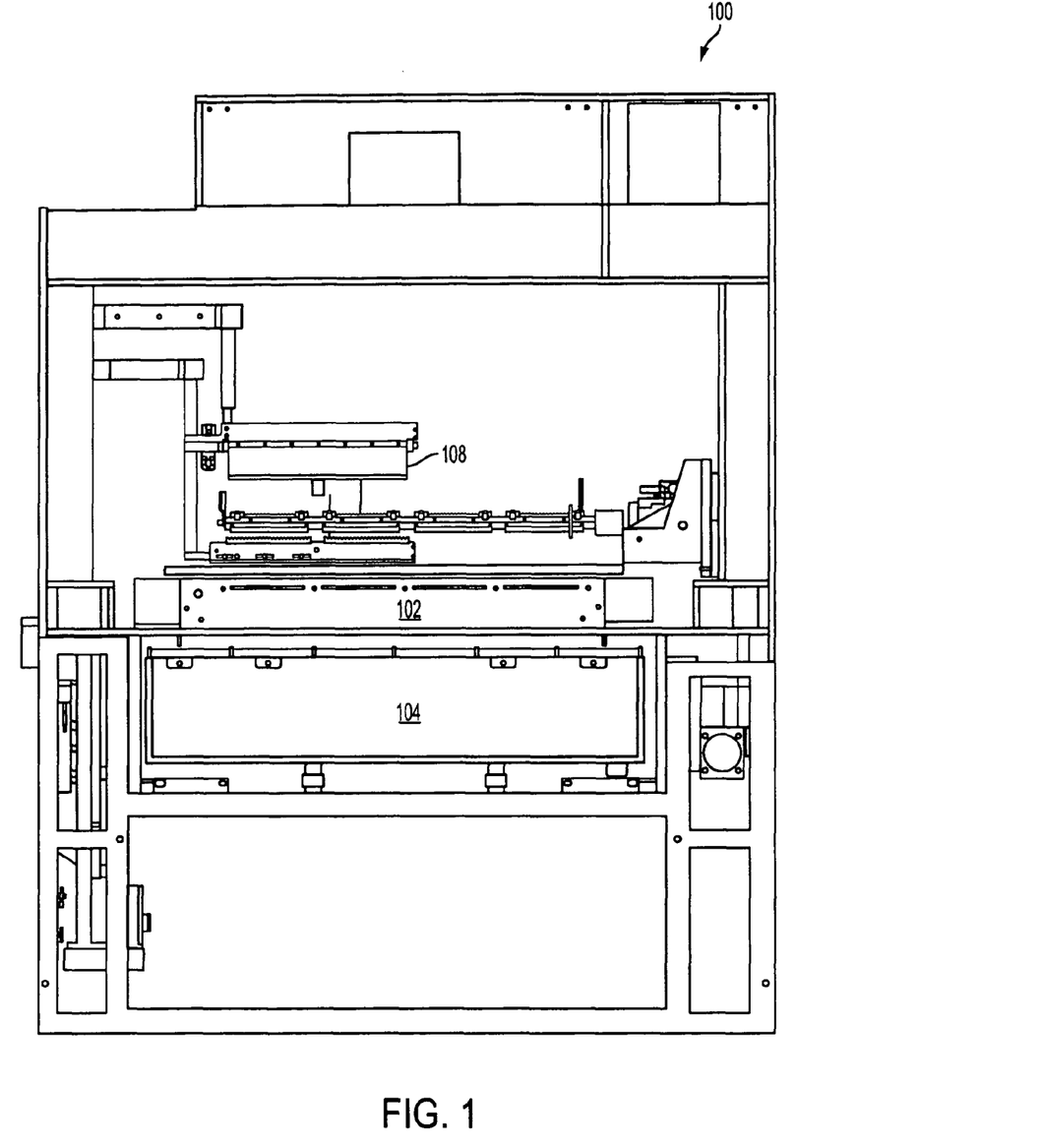
FIG. 1 is a simplified schematic diagram illustrating an overview of a substrate cleaning system using a fluid distribution network in accordance with one embodiment of the invention.

FIG. 1 is a simplified schematic diagram illustrating an overview of a substrate cleaning system 100 using a fluid distribution network in accordance with one embodiment of the invention. The substrate cleaning system 100 can include a drying chamber 102, a cleaning tank 104, and a transport assembly 108. After controlled exposure within the cleaning tank 104, substrate materials are moved via the transport assembly 108 to the drying chamber 102. For further information regarding the transport assembly 108, please see U.S. patent application Ser. No. 11/531,905, filed on Sep. 14, 2006 titled APPARATUS AND METHOD FOR DRYING A SUBSTRATE, which is herein incorporated by reference.

Heated drying gases are distributed throughout the length of the drying chamber 102 in an effort to provide uniform process exposure to the substrate materials. In order to achieve process uniformity, it is desirable to have uniform flow of the drying gases across the entire drying chamber to minimize temperature fluctuations within the drying chamber.

Figure 2:
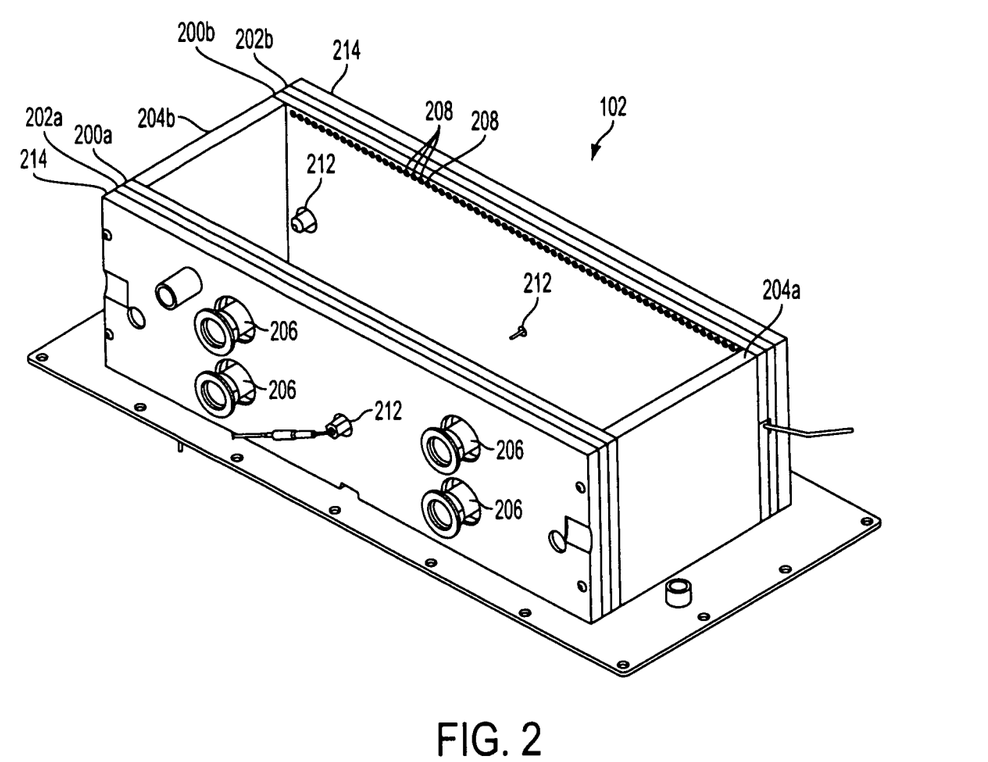
FIG. 2 is an exemplary illustration of the drying chamber in accordance with one embodiment of the present invention.

FIG. 2 is an exemplary illustration of the drying chamber 102 in accordance with one embodiment of the present invention. The interior of the drying chamber 102 is formed by horizontal distribution plates 200a/b and end walls 204a/b. As will be discussed below, the horizontal distribution plates 200a/b have horizontal channels or grooves formed on a surface to assist in the distribution of fluid throughout the drying chamber 102. Mated to the horizontal distribution plates 200a/b are vertical distribution plates 202a/b that will also be discussed in more detail below. As shown in FIG. 2, the horizontal distribution plate 200b can include ports 208 that are open to the interior of the drying chamber 102. Note that ports 208 are also found on the horizontal distribution plate 200a but are not visible in FIG. 2.

In one embodiment of the drying chamber 102, heated drying gases are uniformly dispensed from ports 208 to minimize temperature fluctuations within the drying chamber 102. In other embodiments, gases at varying temperatures, mixtures of liquids at various temperatures, and mixtures of liquids and gases can be dispensed or removed from ports 208. Exterior walls 214 can be affixed to the vertical distribution plates 202a/b to provide insulation for embodiments where temperature control of the chamber is desired. The exterior walls 214 can also be used to increase the robustness of the chamber. The location, shape, and number of ports 208 shown in FIG. 2 are exemplary and should not be construed to limit the scope of the claims. Furthermore, the location, size, and configuration of the ports 208 can be modified as different uses of the chamber may require different fluid flow patterns and different fluid throughput in and out of the chamber.

Vertical distribution plates 202a/b are laminated or secured to their respective horizontal distribution plates 200a/b. The vertical distribution plates 202a/b include vertical channels or grooves formed on a surface that is mated with the respective horizontal grooves of horizontal distribution plates 200a/b to assist in the distribution of fluid throughout the drying chamber 102. The vertical distribution plates 202a/b also include ports 206 that provide access to the vertical channels. In some embodiments, fluid supplies can be attached to ports 206 in order to distribute fluids to ports 208. In other embodiments, a vacuum can be attached to ports 206 in order to remove fluids through ports 208. The combination of fluid supply and vacuum can be used to circulate fluids within the drying chamber 102.

As previously discussed, the chamber 102 can also be used to circulate liquids and combinations of liquid supply and return could be used to circulate liquids within a chamber as well. For example, cleaning tank 104 could use laminated walls to distribute and circulate cleaning liquids to facilitate the removal of contaminates from a work piece. The number of ports 206 can be configured based on each application and can vary depending on necessary throughput and the flow configuration within the chamber. In other embodiments where the chamber can be used for multiple processes, ports 206 can be opened and closed to modify the number of ports 206.

Both the vertical distribution plates 202a/b and the horizontal distribution plates 200a/b can also include additional ports 212 to provide access to the interior of the drying chamber 102. The ports 212 can be used to install sensors or other equipment such as, but not limited to, resonators, transducers, flow meters, hygrometers, and thermocouples to monitor various conditions within the drying chamber. The drying chamber 102 can also include exterior walls 214 that are secured to the vertical distribution plates 202a/b.

Note that the description of the distribution plates as "horizontal" and "vertical" is intended to describe the embodiment shown in FIG. 2. One skilled in the art should recognize that the descriptors of "horizontal" and "vertical" should not interpreted to limit the claims because other embodiments of the distribution plates may have an unlimited variety of channel configurations capable of distributing fluid between the distribution plates.

Figure 3:
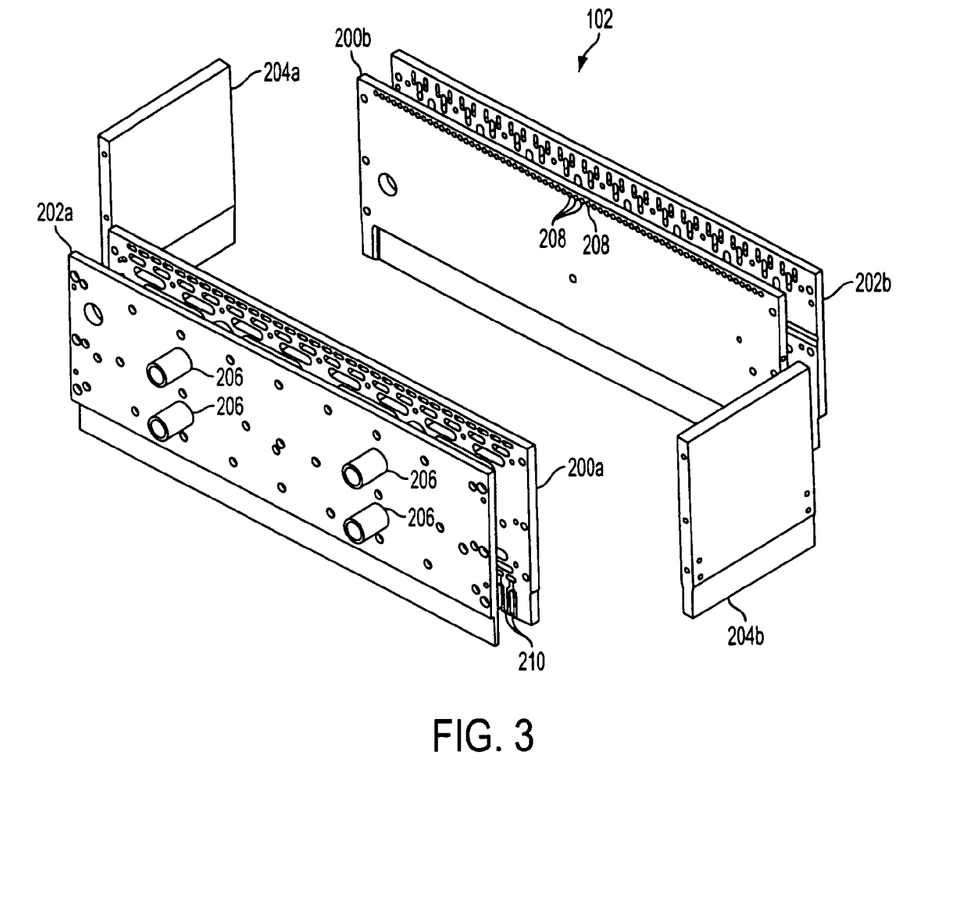
FIG. 3 is an exemplary illustration of an exploded view of a portion of drying chamber in accordance with one embodiment of the present invention.

FIG. 3 is an exemplary illustration of an exploded view of a portion of drying chamber 102 in accordance with one embodiment of the present invention. Vertical grooves can be seen on a surface of the vertical distribution plate 202b. Similarly, horizontal grooves can be seen on a surface of horizontal distribution plate 200a. Also visible on horizontal distribution plate 200a are ports 210 that in this embodiment are diagonally opposed to ports 208. Depending on the type of flow desired within the chamber, the ports 208 and the ports 210 can be placed in a variety of positions. In other embodiments, additional ports or fewer ports can be used to distribute various fluids to the chamber. In the embodiment shown in FIG. 3, Ports 210 can distribute fluids to an area below the drying chamber 102. Ports 210 can also be found on horizontal distribution plate 200b but are not visible in FIG. 3.

In one embodiment, ports 206 are used to supply and return fluids that are distributed via the vertical and horizontal channels to/from ports 210 and ports 208. In other embodiments, a vacuum can be drawn through ports 206 thereby using ports 208 and ports 210 to evacuate fluids from the chamber. In other embodiments, various configurations within the vertical and horizontal distribution plates along with various configurations of fluid supply and vacuum through ports 206 can allow both fluid removal and fluid distribution through ports 208 and/or ports 210.

Figure 4A:
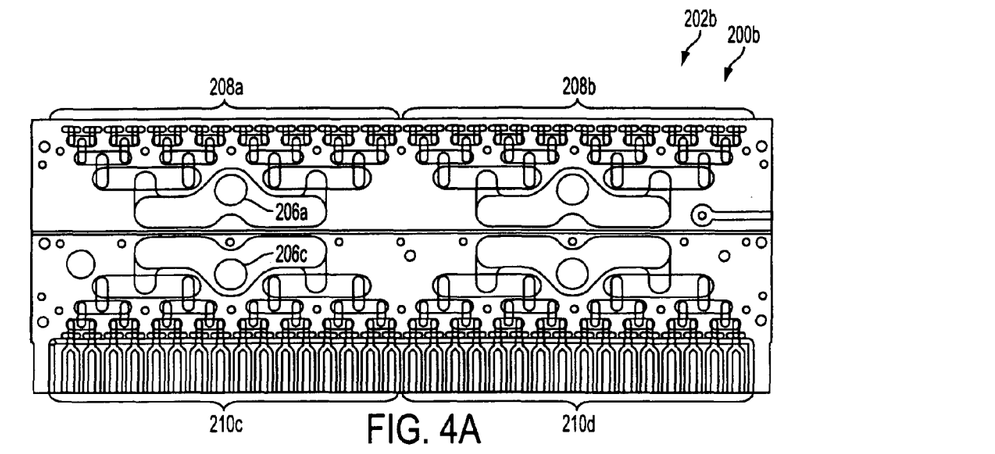
FIGS. 4A and 4B are exemplary views of the alignment of the vertical and horizontal channels of the vertical distribution plate and the horizontal distribution plate in accordance with one embodiment of the present invention.
Figure 4B:
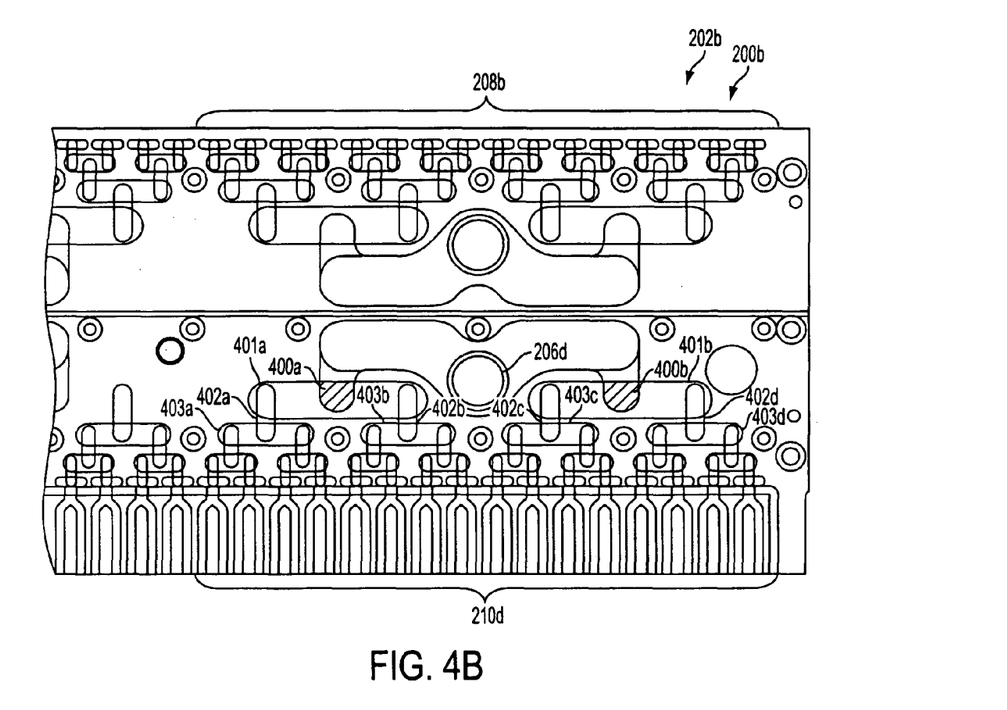

FIGS. 4A and 4B are exemplary views of the alignment of the vertical and horizontal channels of the vertical distribution plate 202b and the horizontal distribution plate 200b in accordance with one embodiment of the present invention. In this view, the horizontal distribution plate 200b has been made semi-translucent in order to see features of the vertical distribution plate 202b. In this embodiment, ports 206a-206d provide access to the distribution network formed by intersections between the horizontal distribution plate 200b and the vertical distribution plate 202b. As seen in FIG. 4A, port 206a provides fluid distribution and/or return to the plurality of ports 208a. Likewise, ports 206b-206d can provide fluid distribution and/or exhaust to the respective ports 208b and ports 210c/d.

FIG. 4B illustrates additional details of the right side of the horizontal and vertical distribution plates shown in FIG. 4A. Fluid introduced through port 206d passes through a volumetric area created by the intersection between the channels of the horizontal distribution plate 200b and the vertical distribution plate 202b. Intersecting areas 400a/b allow the fluid to split into two separate horizontal channels in the horizontal distribution plate 200b. In one embodiment, a summation of the cross-sectional area of a row of channels will result in substantially equal numbers for every row within the horizontal distribution plate 200b. Similarly, the sum of the cross-sectional areas of the vertical channels remains substantially equal for vertical distribution plate 202b. Maintaining a same cross-sectional area between the rows of horizontal and vertical channels promotes uniform fluid flow to all of the ports 208 and 210.

Looking at the distribution network associated with port 206d, intersecting the two horizontal channels 401a/b are four vertical channels 402a-402d that transport the fluid to four horizontal channels 403a-403d. In some embodiments, horizontal channels 401a/b can be viewed as a row of horizontal channels while vertical channels 402a-402d can be viewed as a row of vertical channels. Similarly, horizontal channels 403a-403d can also be viewed as a row of horizontal channels. Thus, the distribution network can be viewed as a collection of intersecting vertical and horizontal rows. In the embodiment illustrated in FIG. 4B, the distribution network associated with port 206d can be viewed to have five rows of horizontal channels and five rows of vertical channels (including the ports 210d). This is slightly different than the distribution network associated with ports 208b that have five rows of horizontal channels and four rows of vertical channels.

As previously described, the sum of the cross-sectional areas for horizontal channels 401a/b is approximately equal to the sum of the cross-sectional area of horizontal channels 403a-403d. The fluid that passes through port 206d continues to be split vertically and horizontally until the fluid is evenly distributed across a specified length of the drying chamber. In this example, the fluid introduced through port 206d, eventually emerges from ports 210d and the sum of the cross-sectional area of ports 210 would be approximately equal to the sum of the cross-sectional area of horizontal channels 401a and 401b.

In some embodiments, summing the cross-sectional areas of each of the ports 210d could result in the cross-sectional area of the port 206d. In other embodiments, fluids can be removed through port 206d and the distribution network formed between the horizontal distribution plate 202b and the vertical distribution plate 200b would evenly remove fluid from across the specified length of the chamber.

Figure 5A:
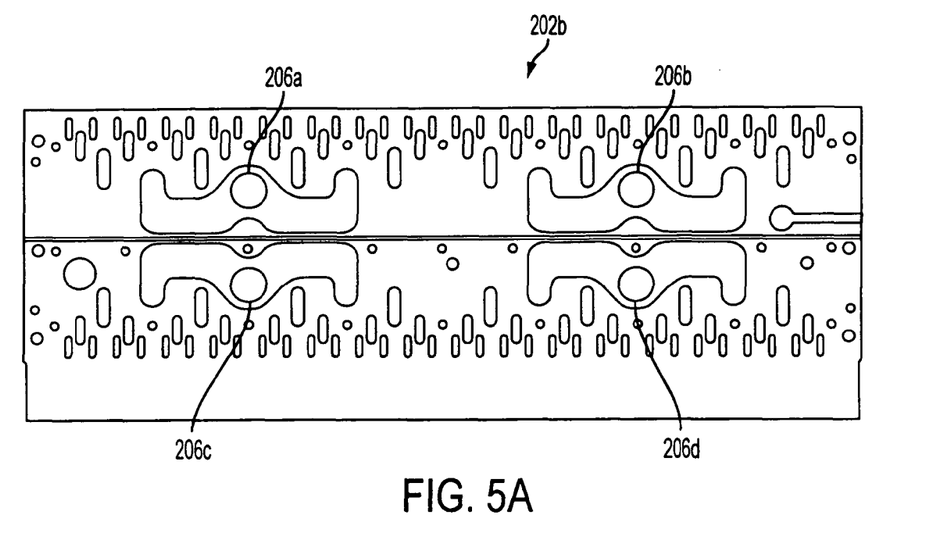
FIGS. 5A and 5B are schematics showing the vertical distribution plate and the horizontal distribution plate in accordance with one embodiment of the present invention.
Figure 5B:
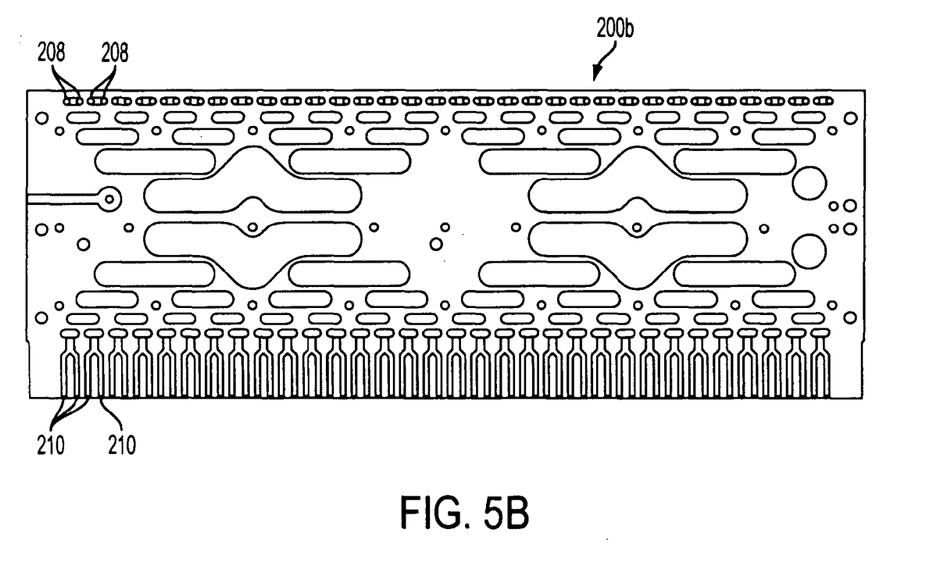

FIGS. 5A and 5B are schematics showing the vertical distribution plate 202b and the horizontal distribution plate 200b respectfully in accordance with one embodiment of the present invention. Separating the vertical distribution palate 202b and the horizontal distribution plate 200b, the cascading nature between the vertical and horizontal channels is evident. The cascading nature of the channels can also enable conservation of energy in chambers where heated or cooled fluids are flowing in and out of the chamber. In embodiments where fluid is input to the chamber, the conservation of energy within the chamber is promoted by transferring some of the incoming fluid energy to the chamber walls. In embodiments where fluid is evacuated from the chamber using a vacuum, some of the outgoing fluid energy can be transferred to the chamber walls.

As illustrated in FIGS. 5A and 5B, the ports 206a-206d are on an opposite plate than ports 210 and/or ports 208. However, in other embodiments, where space constraints may be an issue, the horizontal and vertical channels can be configured so ports 206a-206d can be located on the same distribution plate as ports 210 and/or 208. In either embodiment, space saving and a reduction of an overall footprint of the chamber can be realized by placing input/output hardware necessary for ports 206a-206d within the chamber footprint.

Figure 6A:
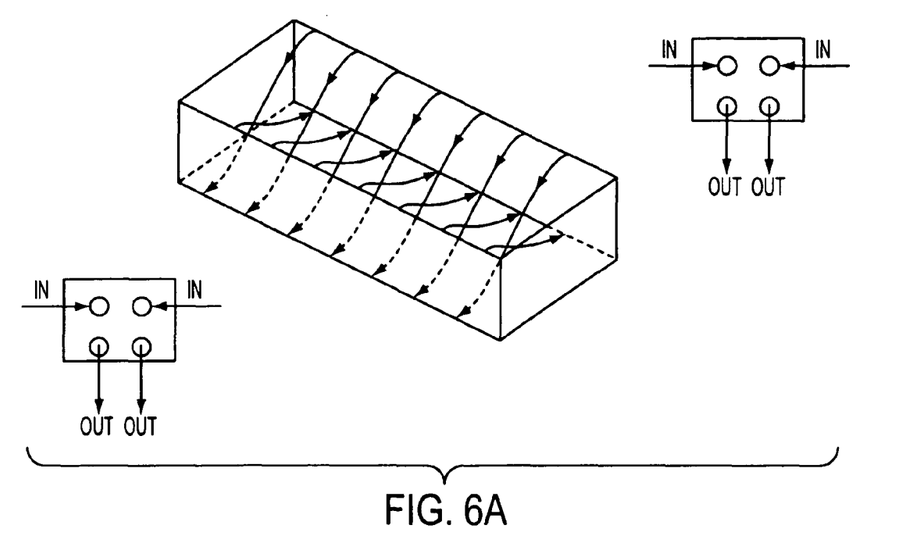
FIGS. 6A-6E are exemplary schematics illustrating various flow patterns that could be established within a chamber in accordance with embodiments of the present invention.

FIGS. 6A-6E are exemplary schematics illustrating various flow patterns that could be established within a chamber in accordance with embodiments of the present invention. In each of the figures the smaller diagrams on the left and right illustrate a type of connection to the ports feeding the distribution network. The various configurations shown should not be construed as limiting as various flow possibilities and port positions can be used to create endless flow configurations and flow patterns. One skilled in the art should also recognize that either gases or liquids could be supplied, distributed and/or returned within the distribution network. FIG. 6A illustrates a flow pattern that could be established by applying a vacuum to ports located on the bottom of a chamber and introducing fluid through ports at the top of the chamber. In this embodiment cross-flow can be established from the top of one side of the chamber to the bottom of the opposing side.

Figure 6B:
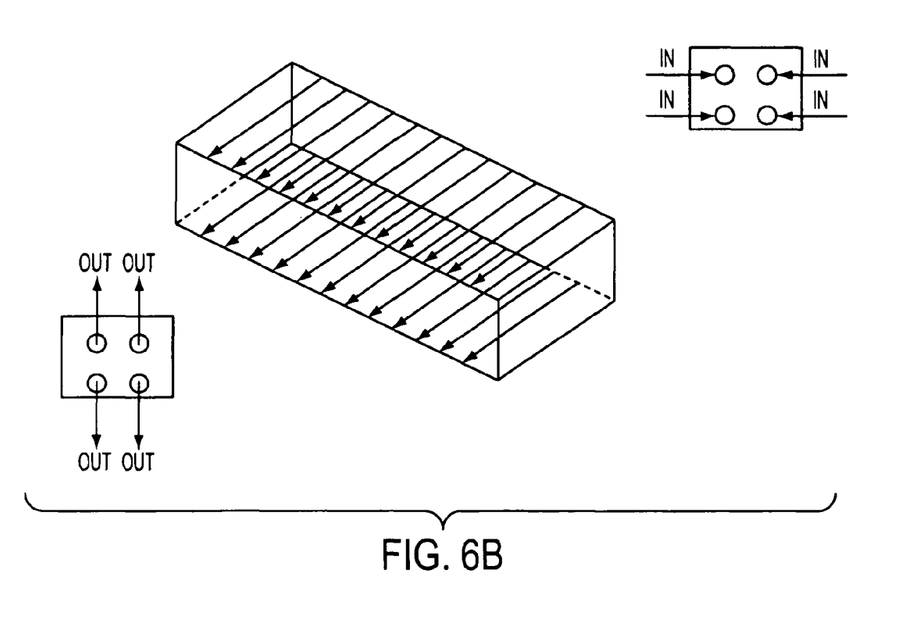
Figure 6C:
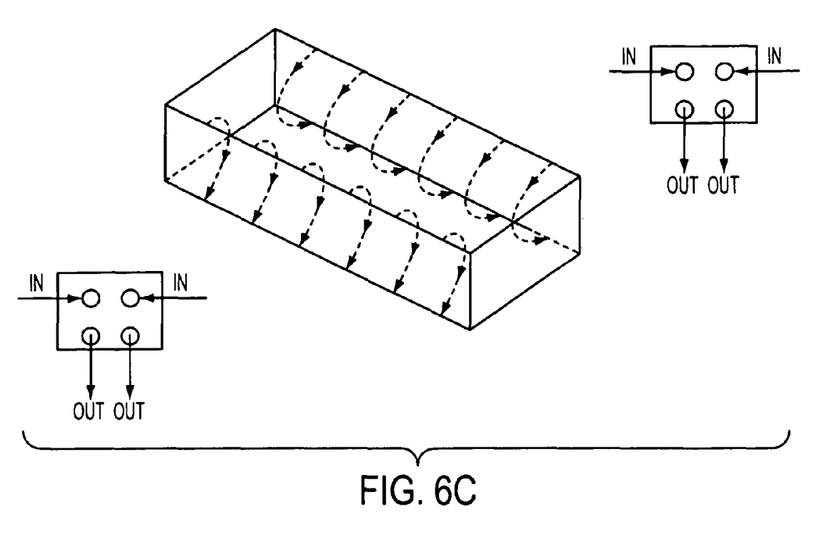

FIG. 6B illustrates a cross-flow pattern that could be established by applying a vacuum to one side of the chamber while supplying fluid to the opposite side of the chamber. FIG. 6C is another exemplary flow pattern that could be induced by applying various vacuum and fluid supplies to a chamber utilizing fluid distribution plates. In this embodiment, fluid can be supplied through the ports at the top of the chamber while a vacuum evacuates fluid from the bottom of the chamber.

Figure 6D:
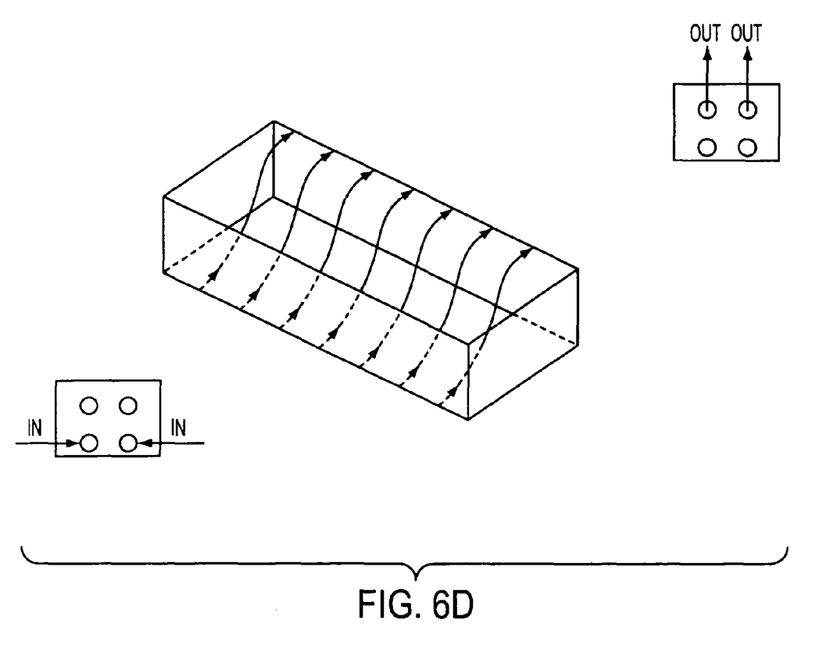

FIG. 6D illustrates as exemplary flow pattern that can be created by not using all of the available ports. In this embodiment, the bottom ports on one side can be used to supply a fluid while the upper ports on the opposite side draw a vacuum. The ability to engage or disengage input and output from the chamber can provide flexibility and allow a single chamber to perform multiple processing operations. Additionally, the fluid distribution plates can be scaled to accommodate various size chambers including, but not limited to rooms within structures or even entire structures. In larger embodiments, where fabrication of the distribution plates from a single piece of material could be difficult, it may be necessary to use modular construction techniques in order to simplify the manufacturing process.

Figure 6E:
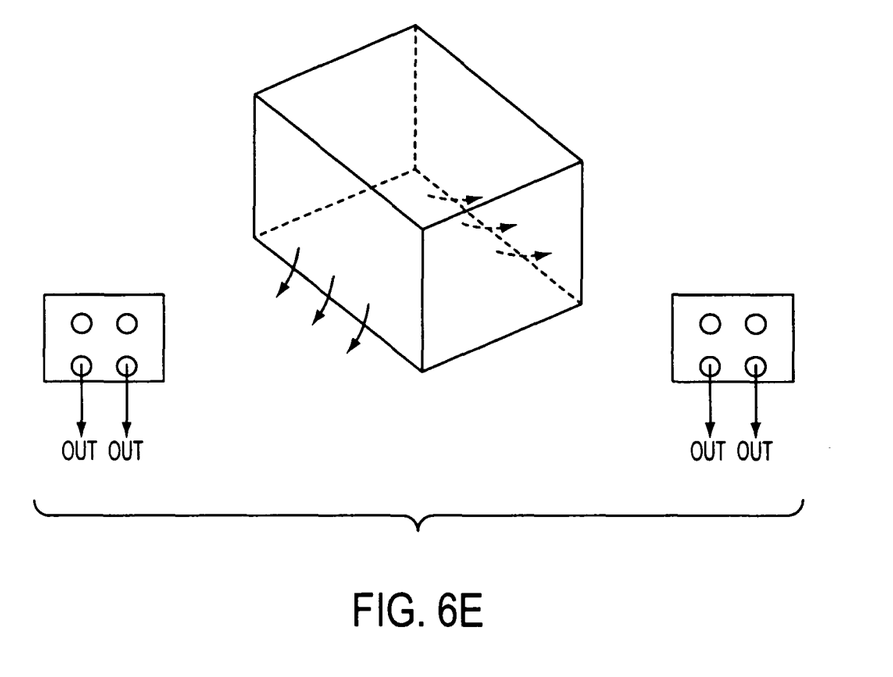

FIG. 6E illustrates an embodiment where an exemplary flow pattern is established to remove fluid from the interior of the chamber. Applying a vacuum to all or some of the lower ports can create such a flow pattern. In other embodiments, gravity can be used in place of a vacuum to draw fluid from the chamber.

Figure 7:
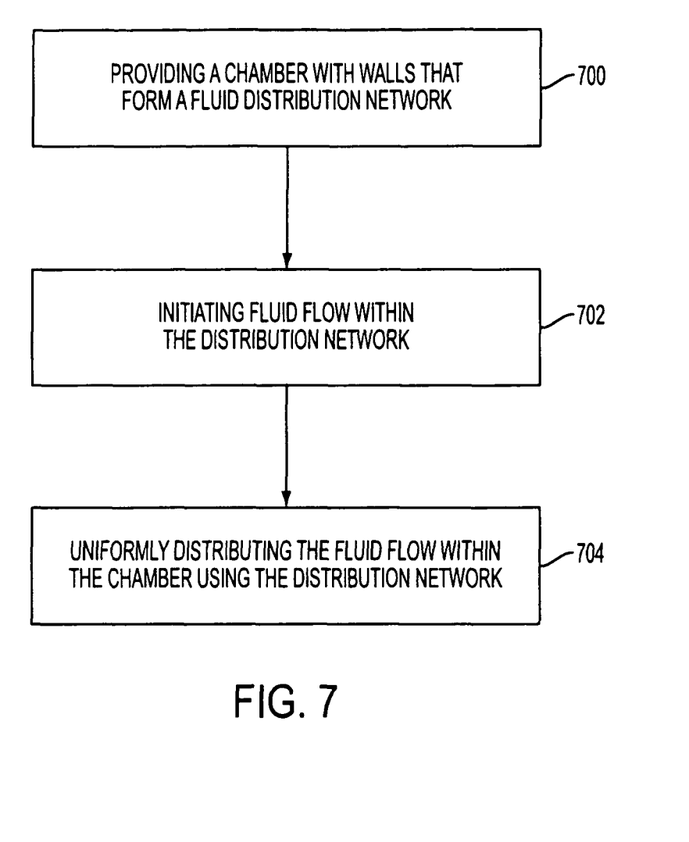
FIG. 7 is a flow chart illustrating exemplary operations for a method to evenly distribute a fluid within a chamber in accordance with one embodiment of the present invention.

FIG. 7 is a flow chart illustrating exemplary operations for a method to evenly distribute a fluid within a chamber in accordance with one embodiment of the present invention. Operation 700 provides a chamber with walls that form a fluid distribution network. In one embodiment, the fluid distribution network can be formed between horizontal distribution plates and vertical distribution plates. As previously discussed, the distribution plates can have channels or grooves that intersect or overlap when affixed together to form the distribution network.

Operation 702 initiates fluid flow within the distribution network. As previously discussed, the fluid flow can be initiated via a port connected to the distribution network. In some embodiments, fluid can be input to the distribution network, while in other embodiments, fluid can be removed from the distribution network.

Operation 704 distributes the fluid flow within the chamber formed by the distribution plates. In some embodiments, the cascading nature of the distribution network can promote the even distribution of fluid. In some embodiments, the distribution network promotes even distribution of fluid within the distribution network by reducing cross-sectional area of the individual channels while increasing the number of individual channels to maintain a constant cross-sectional area for fluid to flow.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A chamber including a fluid distribution network for uniform fluid flow within the chamber, comprising:

a first chamber wall having a first surface and an opposing interior surface, the first surface formed with a first set of channels partially extending into the first surface of the first chamber wall, the interior surface exposed to the interior of the chamber and including a plurality of interior ports connected to a plurality of the first set of channels; and a second chamber wall having a second surface and an opposing exterior surface, the second surface having a second set of channels, the second set of channels partially extending into the second surface of the second chamber wall, the second set of channels partially intersecting the first set of channels, the exterior surface including at least one exterior port providing access to the second set of channels, wherein the first surface and the second surface contact each other along regions external to the first set of channels and the second set of channels, each channel of the first set of channels is horizontally oriented in multiple rows and spaced apart from each other, each channel of the second set of channels is vertically oriented in multiple rows and spaced apart from each other, wherein at least one of the vertically oriented channels partially intersects with multiple horizontally oriented channels, and wherein the uniform fluid flow within the chamber is non-horizontal.

2. The fluid distribution network as described in claim 1, wherein a width of each of the first set of channels along successive rows decreases.

3. The fluid distribution network as described in claim 1, wherein a width of each of the second set of channels along successive rows decreases.

4. The fluid distribution network as described in claim 1, wherein a cross-sectional area of the plurality of interior ports is substantially the same as a cross-sectional area of the exterior port.

5. The fluid distribution network as described in claim 3, wherein a cross-sectional area of a row of vertical channels and a cross-sectional area of a row of horizontal channels is equivalent.

6. The fluid distribution network as described in claim 1, wherein a first exterior port is configured to introduce fluid to the interior of the chamber through a first plurality of interior ports and a second exterior port is configured to remove fluid from the interior of the chamber through a second plurality of interior ports.

7. The fluid distribution network as described in claim 1, wherein fluid from the exterior port is distributed between the first and second chamber walls through the first and second set of channels and distributed within the interior of the chamber through the interior ports.

8. The fluid distribution network as described in claim 1, wherein fluid is removed from the interior by drawing fluid from the interior of the chamber via the interior ports, between the first and second chamber walls through the first and second set of channels and through the exterior port.

9. The fluid distribution network as described in claim 1, further comprising:

a third chamber wall and a fourth chamber wall configured to mirror the first and second chamber walls across the chamber, the third chamber wall and fourth chamber wall disposed opposite the first and second chamber walls, the third chamber wall having a second plurality of interior ports and channels and the fourth chamber wall having a second plurality of channels and an exterior port.

10. The fluid distribution network as described in claim 9, wherein the second plurality of interior ports is diagonally opposed to the plurality of interior ports.

11. A fluid distribution chamber, comprising:

a base having sidewalls extending therefrom, wherein one of the sidewalls includes a first member and a second member affixed to each other, the first member having an inner surface mating with an outer surface of the second member, the inner surface of the first member having a plurality of cavities partially extending into the inner surface of the first member, the plurality of cavities defined in a first pattern of spaced apart rows, the outer surface having a plurality of cavities partially extending into the outer surface of the second member defined in a second pattern of spaced apart rows, wherein a cavity of the first pattern partially intersects with multiple cavities in the second pattern, and wherein the inner surface of the first member and the outer surface of the second member contact each other along regions external to the plurality of cavities, and wherein each cavity of the plurality of cavities of the first pattern is horizontally oriented, each cavity of the plurality of cavities of the second pattern is vertically oriented, and wherein the uniform fluid flow within the chamber is non-horizontal.

12. The fluid distribution chamber as described in claim 11, wherein a sum of cross-sectional areas of the plurality of cavities defined in the first pattern is substantially constant to a sum of cross-sectional areas of the plurality of cavities defined in the second pattern.

13. The fluid distribution chamber as described in claim 11, wherein the cavities of the first pattern of spaced apart rows have an axis of extension that is orthogonal to an axis of extension of the cavities of the second pattern of spaced apart rows.

14. The fluid distribution chamber as described in claim 11 further comprising additional ports, the ports being configured to accommodate accessories.

15. The fluid distribution network as described in claim 1, wherein the regions external to the first set of channels and the second set of channels of the first surface and the second surface are laminated to each other.

16. The fluid distribution chamber as described in claim 11 wherein the regions external to the plurality of cavities of the inner surface and the outer surface are laminated to each other.

\* \* \* \* \*